US00RE36956E

United States Patent [19]

Omori et al.

[11] E Patent Number: Re. 36,956

[45] Reissued Date of Patent: Nov. 21, 2000

[54] FLIP UP SIDE STENCIL TO BE USED WITH SINGLE SITE STENCIL PRINTER

[75] Inventors: Michael K. Omori, Vista; Floyd Gary Miller, Livermore, both of Calif.

[73] Assignee: Mini Micro Stencil, Inc., San Marcos, Calif.

[21] Appl. No.: 09/195,505

[22] Filed: Nov. 19, 1998

Related U.S. Patent Documents

Reissue of:

[64] Patent No.: 5,704,287
Issued: Jan. 6, 1998
Appl. No.: 08/773,436
Filed: Dec. 27, 1996

[51] Int. Cl.[7] ..... B05C 17/08

[52] U.S. Cl. ..... 101/127.1; 101/128.4

[58] Field of Search ..... 101/114, 126, 101/127, 127.1, 128, 128.1, 128.4

[56] References Cited

U.S. PATENT DOCUMENTS

| | | | |
|---|---|---|---|
| 2,066,477 | 1/1937 | Levin | 101/127 |
| 3,025,788 | 3/1962 | Tregoning | 101/127.1 |
| 5,107,759 | 4/1992 | Omori et al. | 101/127.1 |

*Primary Examiner*—Ren Yan
*Attorney, Agent, or Firm*—John J. Murphey

[57] ABSTRACT

Stencils to be used with a solder paste stencil printing process and apparatus in which the stencil plate having a porous figure printing area may be used for single component solder paste application. The printing operation is performed by alignment of the stencil pattern figure over the appropriate component and substrate pads. The stencil holder assembly is attached to the related solder paste stencil printer and held in place by downward force. Solder paste is dispensed over the stencil plate pattern allowing gravity flow of the paste material into the stencil pattern pores. Excess paste material is squeegeed level to the top surface of the stencil plate and the plate lifted from the substrate surface leaving solder paste in the configured pattern.

4 Claims, 3 Drawing Sheets

FLIP UP SIDE STENCIL TO BE USED WITH SINGLE SITE STENCIL PRINTER

Matter enclosed in heavy brackets [ ] appears in the original patent but forms no part of this reissue specification; matter printed in italics indicates the additions made by reissue.

CROSS REFERENCE TO RELATED APPLICATION

The invention of this application is related to the invention of our U.S. Pat. No. 5,107,759 granted Apr. 28, 1992.

BACKGROUND—FIELD OF INVENTION

This invention relates to stencils to be used for single site stencil printing of solder paste onto a printed circuit board.

BACKGROUND—DESCRIPTION OF PRIOR ART

In the conventional process of surface mount technology rework, prototyping, and research and development, exchange or replacement of single components is often encountered. Presently some of the common methods being used to apply solder for placing replacement components onto populated printed circuit boards include:

1. Use of existing solder to mount new component;
2. Deposit of a solder paste bead onto substrate pads;
3. Use of solder tape over substrate pads;
4. Surface tension transfer of solder onto substrate pads;
5. Dispensing of solder dots onto substrate pads Except for solder paste dot dispensing which requires costly equipment or if done manually is tedious, the existing methods often exhibit placement inaccuracy, contamination and inconsistent paste volume from pad to pad resulting in problems in bridging and poor solder joints. It is therefore the object of this invention to provide a functionally simple, consistent, repeatable and economical method and apparatus for solder paste application in single component placement.

On Apr. 28, 1992, U.S. Pat. No. 5,107,759 was issued to Michael Omori and Floyd Gary Miller for a Solder Paste Stencil Printer. Since 1992, the two inventors have found certain design additions to the inventions that have proven to be superior to the original patent. These improvements, however, do not altogether replace the original stencils.

The inventors found that due to technology advancement the component locations required a stencil footprint pattern that was a solid matrix—there being no open area in the middle of the stencil to allow for the shaft to be located, as in the original design. Therefore, the inventors designed a stencil that allowed for mounting blocks to be elevated from the stencil and located to the side rather than on top of the stencil plate. To accommodate the design change, *at least two of* the sides of the stencil were flipped up so that a mounting block could be attached. Incidental to this design change the inventors found that the stencil became more rigid. Finally, the inventors found that flipping up *at least two of* the sides minimized spillage of the solder paste.

OBJECTS AND ADVANTAGES

Accordingly, several objects and advantages of our invention are to provide stencils that allow for varying mounting positions, stencils that are more rigid, and the stencils that minimize spillage of solder paste.

Still further objects and advantages will become apparent from a consideration of the ensuing description and accompanying drawings.

REFERENCE NUMERALS

Figure 1A:
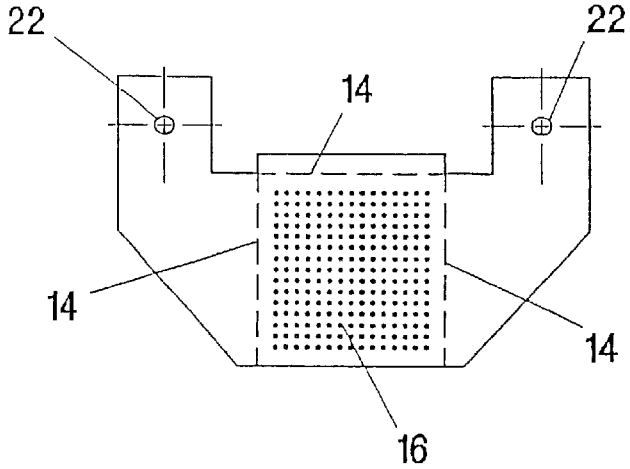
FIG. 1A is a plan view of the unassembled stencil plate.

10 shaft
12 sides
14 etches
16 plate
18 fastener
20 mounting block
22 fastener holes

SUMMARY

In accordance with this addition to U.S. Pat. No. 5,107,759, an apparatus is provided for stencil printing solder paste for single component footprint patterns onto populated printed circuit assemblies, whereby the stencils accommodate varying footprint patterns and varying mounting positions to accommodate solid matrix footprint patterns, are more rigid and minimizes spillage of solder paste.

PREFERRED EMBODIMENT—DESCRIPTION

Referring to FIGS. 1, 2, & 3, the subject stencil holder consists of a stencil plate 16, a mounting block 20, and a shaft 10 whose inside diameter allows it to be slipped over the printer head shaft of the solder paste stencil printer. The sides 12 of the stencil plate 16, fold up along the etches 14. The stencil plate 16 is attached to the mounting block 20 whereby one (1) fastener 18 is attached through fastener holes 22 in each of the sides 12 into the mounting block 20. A shaft is affixed to the mounting block, thus completing a stencil holder. The stencil plate material and surface mount technology pad footprint specifications are publicly available and therefore not further described.

Figure 1B:
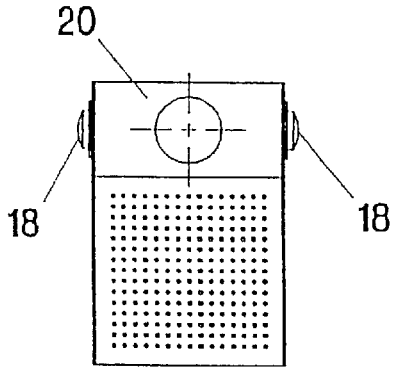
FIG. 1B is a plan view of the assembled stencil holder mounted on the side.
Figure 1C:
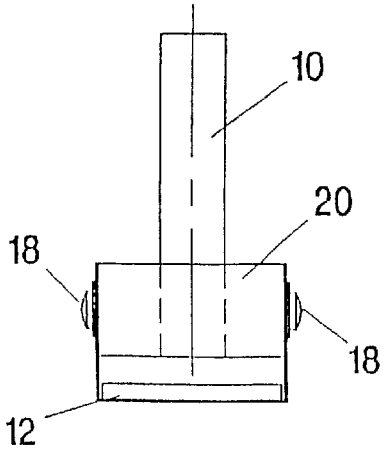
FIG. 1C is an elevation view of the assembled stencil holder mounted on the side.
Figure 1D:
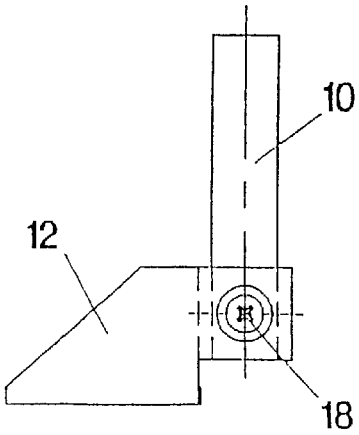
FIG. 1D is a side view of the assembled stencil holder mounted on the side. As noted the sides of the stencil are flipped up. The actual component footprint is not significant to the invention and is not drawn in detail.

Referring to FIGS. 1B, 1C and 1D, the shaft 10 is affixed to the mounting block 20. The mounting block is secured to the stencil plate 16 by two (2) fasteners 18 which are attached on both sides through fastener holes 22 in the stencil plate 16.

Figure 2A:
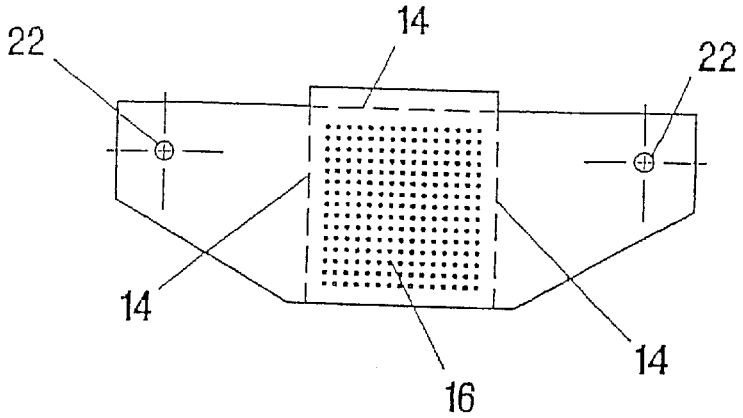
FIG. 2A is a plan view of the unassembled stencil plate.
Figure 2B:
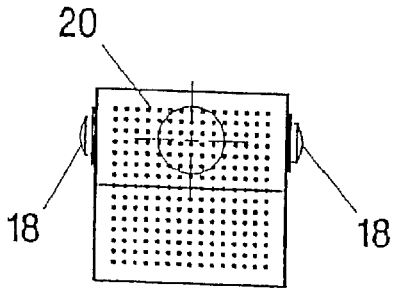
FIG. 2B is a plan view of the assembled stencil holder mounted over the pattern.
Figure 2C:
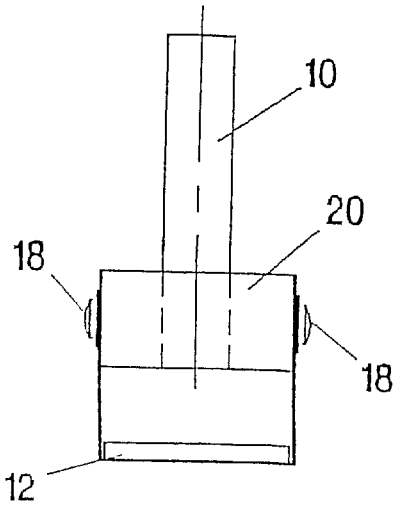
FIG. 2C is an elevation view of the assembled stencil holder mounted over the pattern.
Figure 2D:
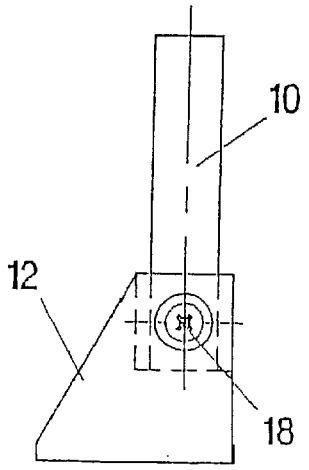
FIG. 2D is a side view of the assembled stencil holder mounted over the pattern. The actual component footprint pattern is not significant to the invention and is not drawn in detail.

Referring to FIGS. 2B, 2C and 2D, the shaft 10 is affixed to the mounting block 20. The mounting block is secured to the stencil plate 16 by two (2) fasteners 18 which are attached on the sides through a fastener holes 22 in the stencil plate 16.

Figure 3A:
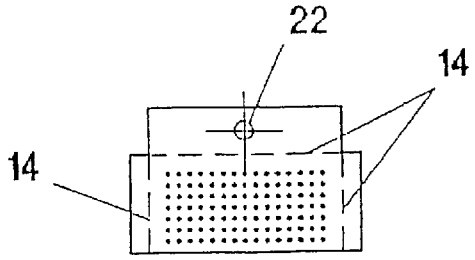
FIG. 3A is a plan view of the unassembled stencil plate.
Figure 3B:
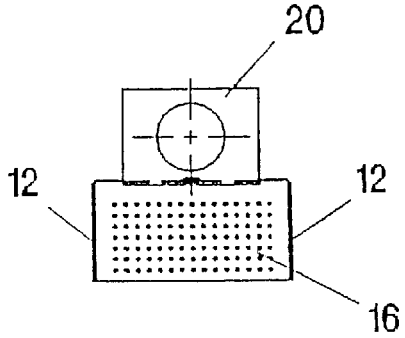
FIG. 3B is a plan view of the assembled stencil holder side mounted for small stencils.
Figure 3C:
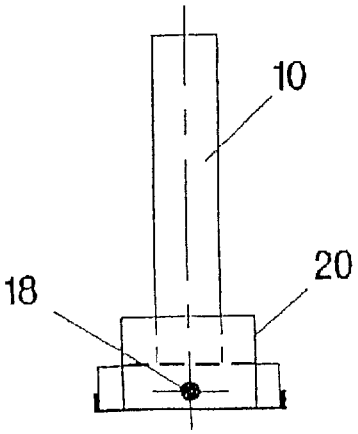
FIG. 3C is an elevation view of the assembled stencil holder mounted for small stencils.
Figure 3D:
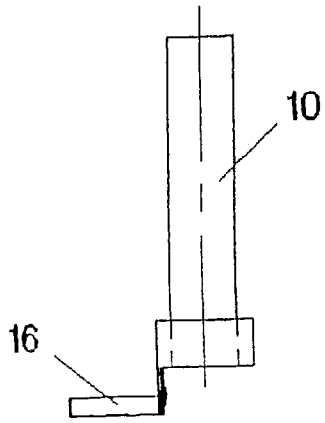
FIG. 3D is a side view of the assembled stencil holder mounted for small stencils. The actual footprint pattern is not significant to the invention and is not drawn in detail.

Referring to FIGS. 3B, 3C and 3D, the shaft 10 is affixed to the mounting block 20. The mounting block is secured to the stencil by one (1) fastener 18 which is attached on the side through a fastener hole 22 in the stencil plate 16. The stencil holder in FIGS. 1 & 2 differs from the stencil holder in FIG. 3 in that the stencil in FIG. 3 allows for mounting very small stencils.

PREFERRED EMBODIMENT—OPERATION

FIGS. 1,2, & 3 all have the same operation but the differing mounting positions allows for varying types of footprint patterns when the matrix does not allow for center mounting. The stencil holder is slipped over the printer head shaft and is held under light friction (The operation is described in greater detail in the U.S. Pat. No. 5,107,759, which this invention is an addition to). Once the stencil holder is in place on the printed circuit board, solder paste is dispensed onto the plate 16 and applied over the stencil apertures and squeegeed to the level of the stencil surface. The methods for paste dispensing and squeegeeing vary and are of individual preference and therefore not further described. The result is the application of the solder paste to single component substrate pads that is accurately located and of consistent quantity and shape.

FIGS. 1, 2 & 3 show the various mounting positions. The sides 12 are folded up along the etches 14. After the sides are folded up, the mounting block 20 is attached by inserting fasteners 18 through the fastener holes 22 into the mounting block 20. The shaft 10 is connected to the mounting block 20, completing a stencil holder.

CONCLUSIONS, RAMIFICATIONS, AND SCOPE

Accordingly, it can be seen that the stencils with the flip-up sides allows for varying types of footprint patterns when the matrix does not allow for center mounting. The flipped up sides allows for mounting onto stencils that have a solid matrix by mounting to a mounting block to the side and above the stencil. The new design also provides stencils that are more rigid and minimizes spillage of solder paste.

Although the description above contains many specificities, these should not be construed as limiting the scope of the invention but as merely providing illustrations of some of the presently preferred embodiments of this invention. Various other embodiments and ramifications are possible within its scope.

Thus the scope of the invention should be determined by the appended claims and their legal equivalents, rather than by the examples given.

What is claimed is:

1. A solder paste stencil holder having a center portion, there being three sides extending from the center portion, with etches along the lines where said side join said center portion, a mounting block, and a shaft comprising:

said center portion comprises a stencil plate, said sides being folded up along the etches;

said mounting block being attached to the stencil plate via said folded-up sides; and said shaft being affixed to the mounting block.

2. A solder paste stencil holder according to claim 1, wherein said stencil holder further comprises:

said stencil plate having a plurality of apertures conforming to a footprint pattern; and said sides being of varying height as to allow the mounting block to be placed in various positions.

*3. A solder paste stencil holder having a center portion, there being three sides extending from the center portion, a mounting block, and a shaft comprising:*

*a) said center portion comprises a stencil plate, two of said sides being folded up;*

*b) said mounting block being attached to the stencil plate via said folded-up sides; and,*

*c) said shaft being affixed to the mounting block.*

*4. The solder paste stencil holder of claim 3 further including an etch line along the line where at least one of said sides join said center portion.*

* * * * *

Disclaimer

Re. 36,956—Michael K. Omori, Vista; Floyd Gary Miller, Livermore, both of Calif. FLIP UP SIDE STENCIL TO BE USED WITH SINGLE SITE STENCIL PRINTER. Patent dated November 21, 2000. Disclaimer filed January 22, 2001, by the assignee, Mini Micro Stencil, Inc.

Hereby enters this disclaimer to claims 1, 2, 3 and 4 of said patent.

*(Official Gazette, May 8, 2001)*